(12) United States Patent
Vinciguerra et al.

(10) Patent No.: US 8,008,102 B2
(45) Date of Patent: Aug. 30, 2011

(54) METHOD OF FORMING LIGHT EMITTING DEVICES COMPRISING SEMICONDUCTING SINGLE WALLED CARBON NANOTUBES

(75) Inventors: Vincenzo Vinciguerra, Biancavilla (IT); Francesco Buonocore, Angri (IT); Maria Fortuna Bevilacqua, Gragnano (IT); Salvatore Coffa, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 139 days.

(21) Appl. No.: 11/958,858

(22) Filed: Dec. 18, 2007

(65) Prior Publication Data
US 2009/0011529 A1    Jan. 8, 2009

Related U.S. Application Data

(62) Division of application No. 10/867,569, filed on Jun. 14, 2004, now Pat. No. 7,329,902.

(30) Foreign Application Priority Data

Jun. 11, 2003  (EP) .................................. 03013122

(51) Int. Cl.
*H01L 51/50* (2006.01)
(52) U.S. Cl. ............ 438/32; 257/E51.04; 257/E33.069; 977/750
(58) Field of Classification Search .............. 438/32; 257/87, E33.069, E51.04
See application file for complete search history.

(56) References Cited

U.S. PATENT DOCUMENTS

| | | | |
|---|---|---|---|
| 6,097,138 A | 8/2000 | Nakamoto | |
| 6,157,047 A * | 12/2000 | Fujita et al. | 257/51 |
| 6,872,471 B2 | 3/2005 | Epstein et al. | |
| 6,930,330 B2 * | 8/2005 | Choi et al. | 257/87 |
| 2002/0192441 A1 * | 12/2002 | Kalkan et al. | 428/209 |
| 2003/0098488 A1 | 5/2003 | O'Keeffe et al. | |
| 2003/0168665 A1 * | 9/2003 | Kim et al. | 257/80 |
| 2003/0205457 A1 | 11/2003 | Choi et al. | |
| 2004/0061422 A1 | 4/2004 | Avouris et al. | |

FOREIGN PATENT DOCUMENTS

| | | |
|---|---|---|
| EP | 0 877 428 A2 | 11/1998 |
| EP | 1 063 197 A2 | 12/2000 |
| JP | 2002-33193 A | 1/2002 |

OTHER PUBLICATIONS

Fournet, P. et al., "Enhanced brightness in organic light-emitting diodes using a carbon nanotube composite as an electron-transport layer," J App Phys 90(2):969-975, Jul. 15, 2001.

Kim et al., "Electrical an doptical studies of organic light emitting devices using SWCNT's-polymer nanocomposites," Optical Materials 21(1-3):147-151, 2002.

(Continued)

*Primary Examiner* — Phat X Cao
*Assistant Examiner* — Abul Kalam
(74) *Attorney, Agent, or Firm* — Lisa K. Jorgenson; Hai Han; Seed IP Law Group PLLC

(57) ABSTRACT

The present invention relates to a new light emitters that exploit the use of semiconducting single walled carbon nanotubes (SWNTs). Experimental evidences are given on how it is possible, within the standard silicon technology, to devise light emitting diodes (LEDs) emitting in the infrared IR where light emission results from a radiative recombination of electron and holes on semiconducting single walled carbon nanotubes (SWNTs-LED). We will also show how it is possible to implement these SWNTs-LED in order to build up a laser source based on the emission properties of SWNTs. A description of the manufacturing process of such devices is also given.

17 Claims, 8 Drawing Sheets

OTHER PUBLICATIONS

Mueller et al., "Silizium als Lichtquelle," Elektronik 45(14):52-56, Jul. 9, 1996.

Bachilo, S. et al., "Structure-Assigned Optical Spectra of Single-Walled Carbon Nanotubes," Science, vol. 298, pp. 2361-2366, Dec. 20, 2002.

Misewich J. A. et al., "Electrically Induced Optical Emission from a Carbon Nanotube FET," Science, vol. 300, pp. 783-786, May 2, 2003.

O'Connell, M. et al., "Band Gap Fluorescence from Individual Single-Walled Carbon Nanotubes," Science, vol. 297, pp. 593-596, Jul. 26, 2002.

\* cited by examiner

METHOD OF FORMING LIGHT EMITTING DEVICES COMPRISING SEMICONDUCTING SINGLE WALLED CARBON NANOTUBES

BACKGROUND

1. Technical Field

The present invention relates to a light-emitting device including a p-insulator or a Si-n nanojunction region.

2. Description of the Related Art

Carbon nanotubes (CNTs), discovered by Iijima in S. Iijima *Nature* 354 56 (1991), as a by-product of the fullerene soot, are carbon hollow cylindrical-shaped molecules that, having a diameter of few nanometers and a length ranging in the micron scale, can be considered as molecular nanowires.

Their properties are determined by the number of graphene sheets (walls) forming a nanotube and by the fashion their atoms arrange in a wall. In particular, with respect to the number of graphene-sheets forming a nanotube, carbon nanotube basically occur in two distinguished types: MWNTs (Multi Walled NanoTubes) and SWNTs (Single Walled NanoTubes). Whereas, SWNTs are further characterized by the arrangement of hexagons, described by the chiral vector C, forming the honeycomb structure of the wrapped graphene sheet, with respect to the axis of the tube.

SWNTs have emerged in the field of molecular electronics because of their unique properties that allow for the manufacturing of devices such as FETs (field effect transistors) and SETs (single electron transistors). See in this respect the prior works by: S. J. Tans, A. R. M. Verschueren and C. Dekker *Nature* 393 49 (1998); R. Martel, T. Schmidt, H. Shea, T. Hertel and Ph. Avouris *Appl. Phys. Lett.* 73 2447 (1998); and S. J. Tans, M. H. Devoret, H. Dai, A. Thess, R. E. Smalley, L. J. Geerligs and C. Dekker *Nature* 386 474 (1997).

As a matter of fact, with respect to the conduction properties, SWNTs can be either semiconducting or metallic nanotubes, depending on the 'wrapping' of the graphene sheet (i.e., on their chiral vector). See in this respect: H. W. Ch. Postma, T. Teepen, Z. Yao, M. Grifoni and C. Dekker *Science* 293 76 (2001); M. Bockrath, D. H. Cobden, P. L. McEuen, N. G. Chopra, A. Z. A. Thess and R. E. Smalley *Science* 275 1922 (1997); A. Thess, R. Lee, P. Nikolaev, H. Dai, P. Petit, J. Robert, C. Xu, H. Lee, S. G. Kim, D. T. Colbert, G. Scuseria, D. Tomanek, J. E. Fischer and R. E. Smalley *Science* 273 483 (1996).

On the other hand, the recent finding of light emission or fluorescence in the near IR region from semiconducting SWNTs and FETs based on SWNTs increases and spreads the interest about the optical properties of these materials.

Because of the potential applications that would result from the exploitation of the optoelectronic properties of SWNTs (i.e., the possibility of building new devices), it is worthwhile to study the interaction of carbon nanotubes with radiation, especially in the near IR region that is of major interest in the field of telecommunication. Article of some interest are the following: M. J. O'Connell, S. M. Bachilo, C. B. Huffman, V. C. Moore, 1 M. S. Strano, E. H. Haroz, K. L. Rialon, P. J. Boul, W. H. Noon, C. Kittrell, J. Ma, R. H. Hauge, R. B. Weisman, R. E. Smalley, *Science* 297 593 (2002); Sergei M. Bachilo, Michael S. Strano Carter Kittrell, Robert H. Hauge, Richard E. Smalley, R. Bruce Weisman, *Science* 298 2361 (2002); J. A. Misewich, R. Martel, Ph. Avouris, J. C. Tsang, S. Heinze, J. Tersoff, *Science* 300 783 (2003).

BRIEF SUMMARY

One embodiment of the present invention provides a light emitting diode (LED) emitting in the infrared IR spectrum where the light emission results from a radiative recombination of electron and holes on semiconducting single walled carbon nanotubes (SWNTs-LED), by using standard silicon technology. In other words, one embodiment of the present invention is that of implementing a SWNTs-LED in order to build up a laser source based on the emission properties of SWNTs.

One embodiment of the present invention focuses on the optical response of SWNTs, and in particular the optical behaviour of opportunely purified SWNTs deposited on a Si substrate in the infrared region (IR), by using several and also complementary techniques, such as the FT-IR spectroscopy (Fourier transformed infrared spectroscopy), the Raman spectroscopy and compare these results with the optical response of SWNTs in the ultraviolet, visible and near infrared (UV-vis-near IR) region, which is of interest because of the energy gap of semiconducting SWNTs.

One embodiment of the present invention provides for a light-emitting device including a p-insulator or a Si-n nanojunction region and comprising at least a layer including semiconducting single walled carbon nanotubes (SWNTs).

Advantageously at least two p and n doped silicon electrodes delimit a very thin insulating dielectric film wherein semiconducting SWNTs are embedded.

Another embodiment of the present invention provides the manufacturing process of such a device.

The features and advantages of the light emitting diode and its manufacturing method will be apparent from the following description of an embodiment thereof given by way of non-limiting example with reference to the attached drawings.

DETAILED DESCRIPTION

Figure 3:
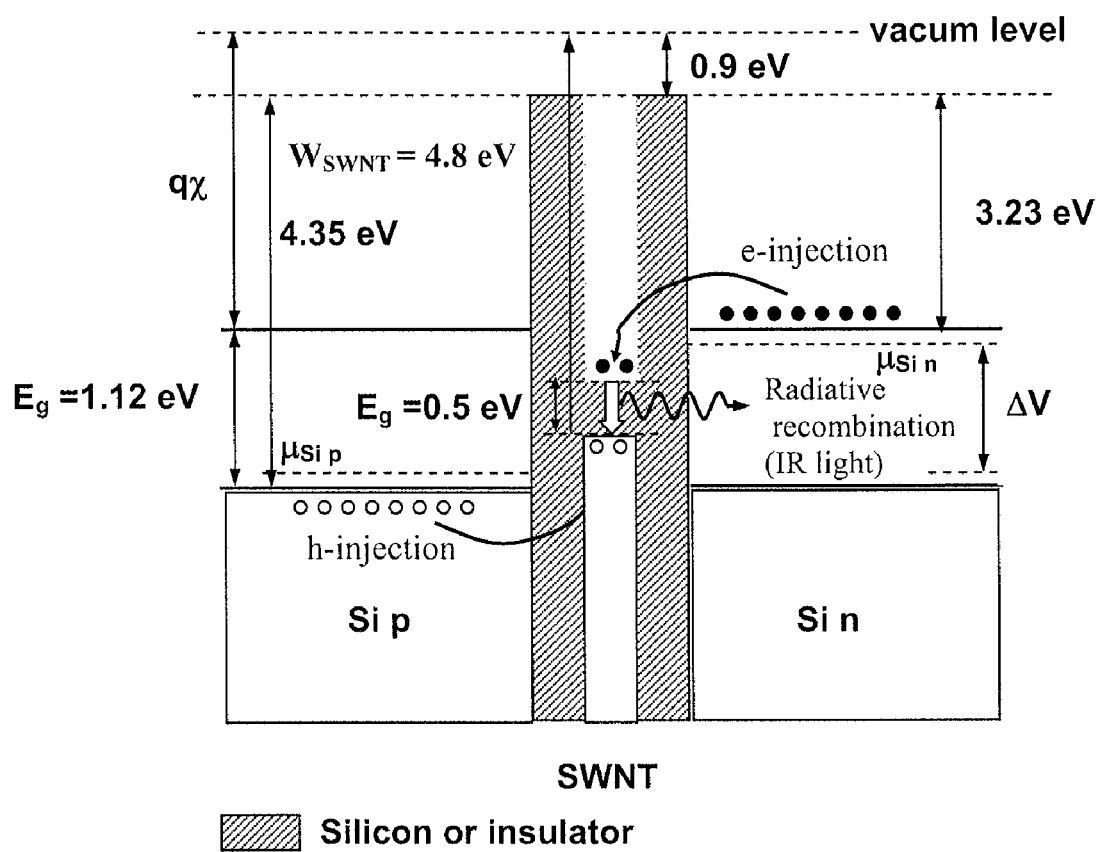
FIG. 3 is schematic view of a band diagram of the LED based on SWNTs according to the present invention with biased electrodes.
Figure 4:
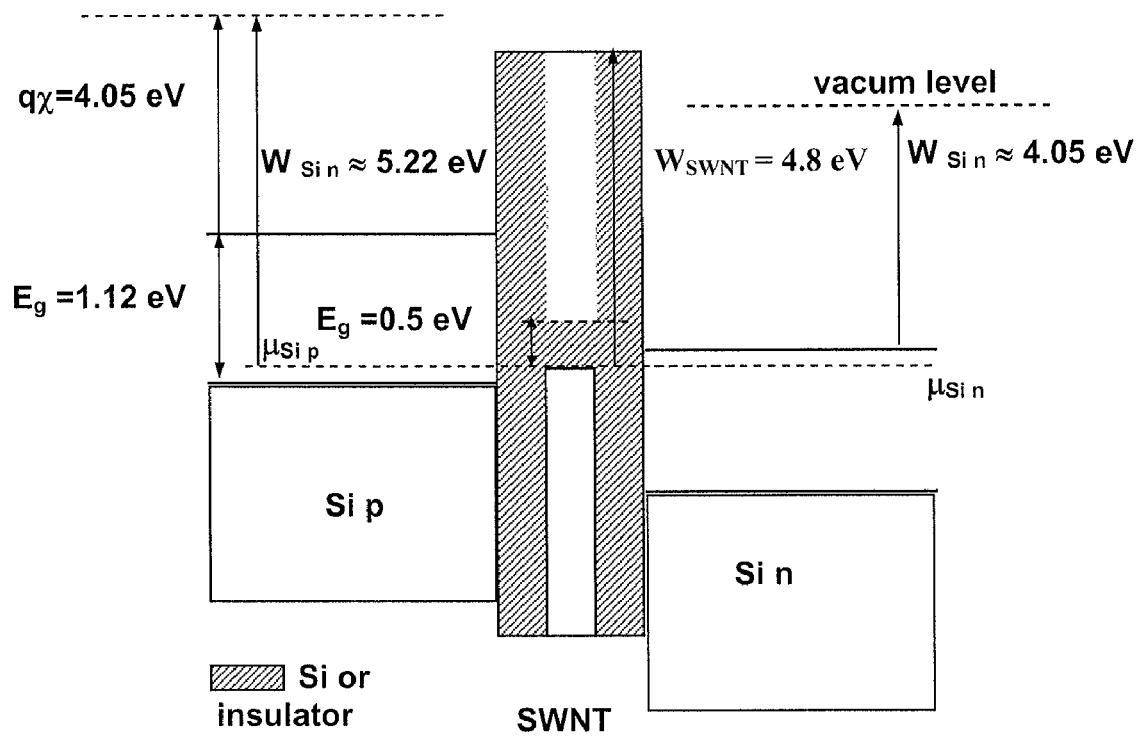
FIG. 4 is schematic view of a band diagram under equilibrium conditions.

With reference to the drawings, and specifically to the example of FIG. 3, a light emitting device according to the present invention is globally and schematically shown with the numeral reference 1.

This device 1 may be a light emitting diode employing SWNTs as interface between two doped semiconductor regions.

Until now it lacks a genuinely electroluminescent device based on carbon nanotubes. According to the present invention, it is possible to build up such a device as a LED and a laser source where SWNTs are used as an active material.

According to one embodiment of the invention a light emitting diode (LED) is provided with a laser based on single walled carbon nanotubes (SWNTs) and semiconductor technologies, emitting radiation in the near infrared (IR) range (760 nm-2500 nm).

Experimental evidences of possible charge injection from a doped silicon substrate to a thin film of purified SWNTs suggests the employment of SWNTs as interface between two suitably doped semiconductors in which the injected holes and electrons can be recombined. This involves several applications and hereinafter at least two related embodiments will be disclosed based on this idea.

Up to now technology lacks of a light emitting device that can be easily and cheaply grafted on silicon substrate. Moreover, it has only been possible to build up light sources for fiber optics from indium phosphide (InP), however, miniaturized circuits based on InP chip have not yet been manufactured. Thus, device 1 may find several applications, such as: fiber-optic telecommunications, information processing (such as in compact-disc players) and optically interconnected circuits. Specifically, the inventive device is able to emit light with a 1.5-micrometers wavelength required in optical telecommunications, and have the advantage of being of much smaller size than a conventional InP chip.

Furthermore, GaAs lasers are typically used in information processing. However, they are not suitable for telecommunication applications because GaAs lasers emit with a wavelength of 0.85 micrometers, which is useful only for short-distance communications. Unfortunately LEDs are typically built on wafers of GaAs for the reason that it is hard to create good-quality GaAs films on silicon chips.

We will now show that device 1 can emit lights at the 1.5-micrometers wavelength, since we have theoretically calculated and measured a band gap corresponding to this wavelength in the sample (interface $Si/SiO_2/SWNTs$).

Figure 1:
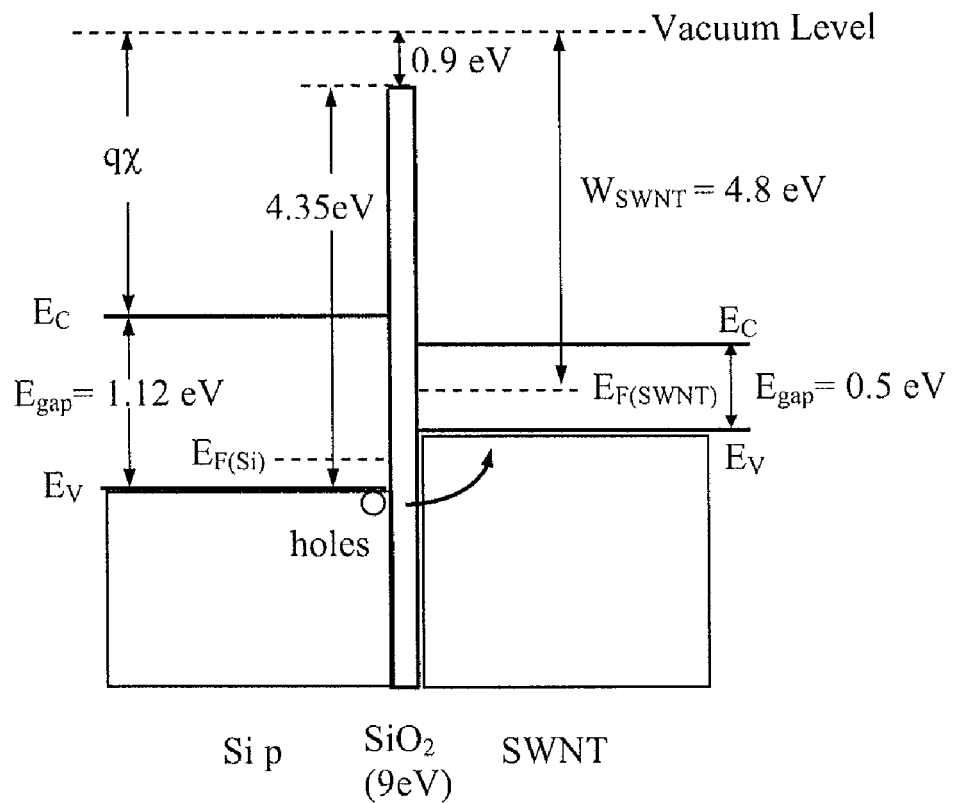
FIG. 1 schematically shows an interface formed by a Si p⁻ substrate, with its native oxide or a Si thin layer, and an ensemble of metal and semiconducting SWNTs deposited on the Si surface; and wherein hole injection is possible according to the difference in the work functions between Si and SWNTs.

FIG. 1 schematically shows an interface formed by a Si p⁻ substrate, with its native oxide or a Si thin layer, and an ensemble of metal and semiconducting SWNTs deposited on the Si surface. We have investigated the behavior of this $Si/SiO_2/SWNTs$ interface with respect to light absorption and observed that light absorption occurs at the gap of semiconducting SWNTs, for those nanotubes that have a gap within that of silicon.

In order to evidence the presence of a gap in a nanotube, holes must be injected. This is accomplished by Si p⁻ injecting the holes because of the difference in the work functions between Si and SWNT. "Work function" as used herein refers to the energy required to release an electron from a crystal lattice, such as that in Si or SWNT. On the other hand, semiconducting SWNTs that have energy gaps ranging in the interval of 0.5-1.0 eV, have a direct band gap that determines the luminescence phenomena that have been observed so far. For example GaAs and InP are direct band gap semiconductors.

For this reason also in SWNTs, many have reported the presence of luminescence and the possibility to build IR electroluminescent devices that emit light as a 'by-product' of their working as a field effect transistor (FET). Therefore, according to one embodiment of the invention, a semiconducting p-n junction is provided as the active material for LEDs and lasers. Holes and electrons are injected in this junction where they undergo a radiative recombination. This process occurs because the junction is formed by direct band gap semiconductors.

Although it is possible to build up diodes based on Si p-n junction, these devices cannot work as LEDs, because of the indirect band gap of silicon. In fact, although the charge injection of holes and electrons occurs, light emission is a low probability process. Hole-electron recombination in silicon occurs in a non-radiative way.

On the other hand, semiconducting SWNTs having a direct band gap could work as an LED emitting in the IR region, if used as intermediate material between a p and an n semiconductor. Moreover, it is possible to build up a LED based on SWNTs, by exploiting the same technology that has been developed for the silicon junctions.

Figure 2:
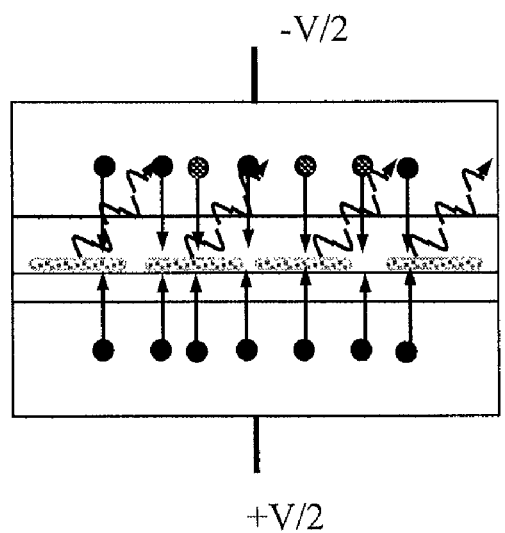
FIG. 2 is schematic view of a P-insulator or (Si)-n nanojunction with the SWNTs embedded.

The working principle of the invention is shown in FIG. 2. Device 1 comprises a p-insulator or Si-n nanojunction where two silicon electrodes, doped with p and n respectively, delimit a very thin (5-10 nm) insulating dielectric film (i.e., silicon oxide, Si) including or embedding the SWNTs.

In this thin central dielectric film, the SWNTs, more specifically, semiconducting SWNTs are embedded.

Since the SWNTs have semiconducting features, such as those in direct band gap semiconductors, it is very likely that a pair formed by an electron and a hole that happens to encounter a nanotube will undergo radiative recombination at the gap. Charge injection is determined by applying a voltage to the electrodes. Electrons and holes have to tunnel the very thin insulator in order to achieve the radiative recombination.

Figure 5:
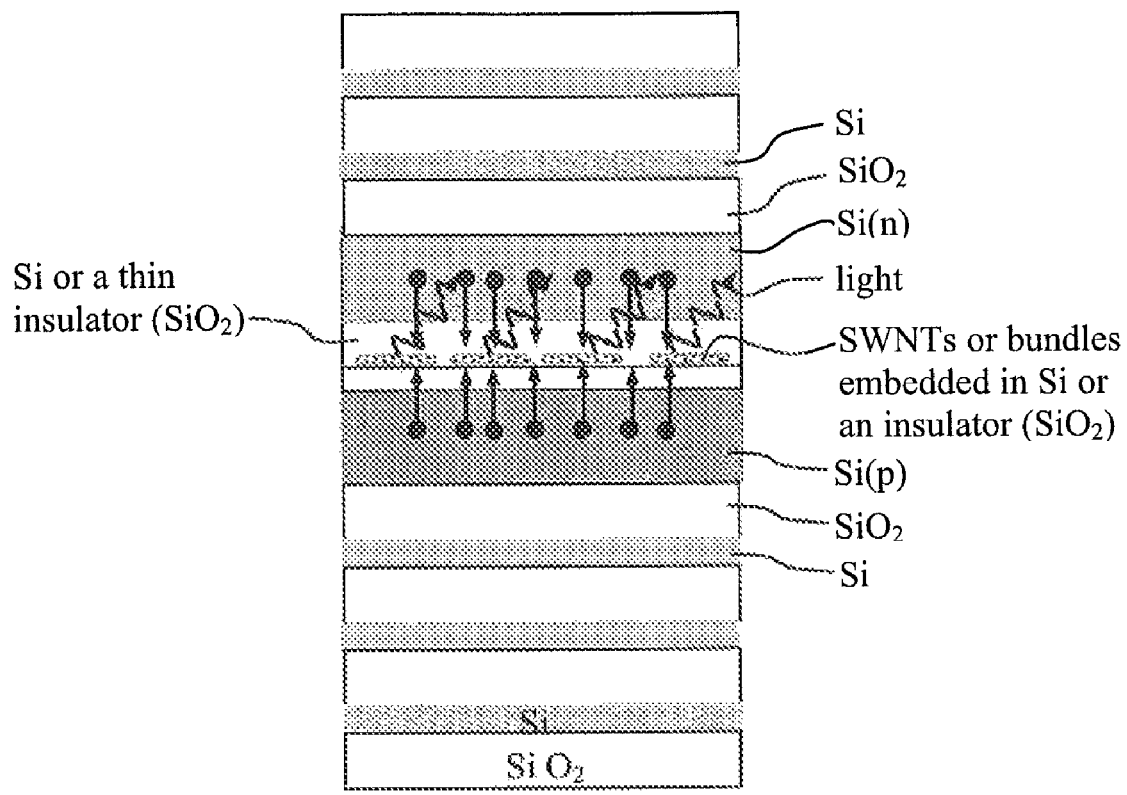
FIG. 5 is a schematic view of a Fabry-Perot microcavity, comprising for example two distributed Si/SiO$_2$ Bragg reflectors, wherein the Si/SiO$_2$ layers and the central region can be obtained by annealing the films deposited by PECVD.

One embodiment of the present invention further provides a Fabry Perrot microcavity by devising two Bragg-Reflectors obtained by alternating Si and $SiO_2$ layers each being a few 100 nm thick. A Fabry-Perot microcavity is shown schematically in FIG. 5 and comprises two distributed $Si/SiO_2$ Bragg reflectors, wherein the $Si/SiO_2$ layers and the central region can be obtained by the annealing of films deposited by PECVD. The thickness of the Si (57 nm) and $SiO_2$ (141 nm) layers match $\lambda_0/4$ n, $\lambda_0/2$ n, respectively, where $\lambda_0$ is the intended value of the resonance (i.e., equal to $\lambda_0$=832 nm) and n the refractive index. The central region plays the role of an active medium, which in our case is formed by the light emitting diode based on SWNTs where the Si electrodes are formed by highly doped p and n silicon.

In this way a method to confine the emerging light in the cavity is obtained.

In order to achieve a laser effect, it's suitable to obtain an inversion of population that can be realized by using highly doped semiconductors. In this case our laser source will resemble that of an Esaki-Tunnel diode that will work as a light emitter, where an inversion of population is possible.

An Esaki Tunnel Diode is typically obtained from a p-n junction by using highly doped p and n semiconductors. In this case the depletion layer is about 10 nm and electrons and holes can tunnel the barrier, giving rise to a tunneling current which depends on the density of the state. In our case, however, the tunneling current of electrons and holes will encounter the states determined by SWNTs, which differs from that of an Esaki Diode. As a result, we will have the radiative recombination of holes and electrons, wherein, the characteristic Current (I) vs. Voltage (V) curve of the inventive diode will resemble that of the Esaki diode but the energy will be converted in radiation i.e., light.

A further embodiment of the present invention provides a manufacturing method of the device 1.

After building a lower electrode, a small amount of SWNTs are deposited on the surface which is covered with the native oxide or by a very thin layer of silicon oxide or Si (Si is an insulator for SWNTs).

SWNTs can be deposited after a purification process, or after a CVD growth, avoiding the oxidation of the Si surface.

After that, a thin layer of an insulator is grown to form a layer of a few nm thick (10 nm at maximum). On the top of this layer where the SWNTs are embedded, a complementary layer of Si is grown.

In order to build a laser, by using the standard technology, which alternate the growth of Si and native oxide or any alternating structure that has the property to confine light because of its reflectance, it is possible to build a Fabry Perrot cavity tuned to the wavelength of choice that determines the resonance and hence the light that will be lasing.

On the other hand in order to reach a high level of injection the two electrodes may be realized by using highly doped Si n and p.

The present invention is further illustrated by the following non-limiting examples. Unless otherwise noted, all scientific and technical terms have the meanings as understood by one of ordinary skill in the art.

EXAMPLE

Example 1

Preparation of SWNTs

Figure 6:
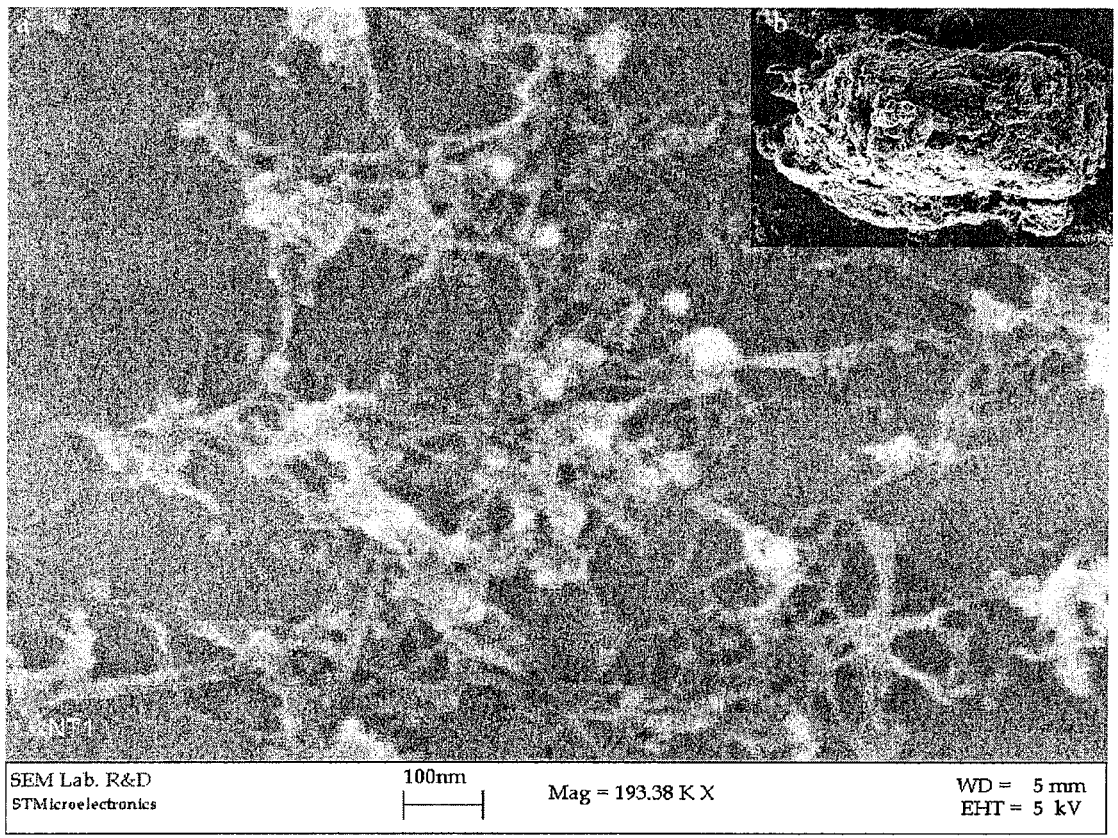
FIG. 6 is a photograph of a SWNTs deposited on Si p⁻ wafer, along the (100) orientation, wherein the aspect of a grain of the pristine soot before the purification process is shown in the insert (b)

As shown in FIG. 6, the material that appears as grayblackish soot in the photographs requires a purification treatment in order to separate the SWNTs from the amorphous carbon and the residues of the metal nanoparticles such as Ni and Y that are used as catalysts during the growth.

In order to remove these residues we adopted a purification method consisting of an oxidation process that uses hydrogen peroxide ($H_2O_2$) similar to that reported by X.-P. Tang, A. Kleinhammes, H. Shimoda, L. Fleming, K. Y. Bennoune, S. Sinha, C. Bower, O. Zhou, Y. Wu *Science* 288 492 (2000).

In detail, a small amount of the pristine soot (11.2 mg) was mixed with 100 ml of $H_2O_2$ (30%) and the blend was heated for 5 h under reflux conditions at the temperature of 100° C. The remaining solid residue was filtered (paper average pores dimension 2.7 µm) and rinsed in methanol (95%). After that the solid residue was mixed with 30 ml of deionized water and mildly sonicated for 20 min at 75° C. in order to obtain a suspension.

Samples were prepared by depositing few drops of the suspension on a Si p$^-$ substrate, along the (100) orientation. Subsequently the samples were dried up overnight and analyzed according to standard techniques.

Routine structural characterization has been carried out by means of an FE-SEM Leo 1550 (field emission scanning electron microscope) having a lateral resolution of about 4 nm. Optical characterization has been achieved both in the infrared IR region as well as in the UV-Vis near IR region. Spectra have been recorded, in the infrared (IR) region, by using a spectrum one FT-IR (Perkin-Elmer), whereas Raman spectroscopy has been obtained by means of a Raman Jobin Yvon U1000. Spectra in the UV-Vis near IR region have been obtained with a Lambda 900 UV-vis/NIR spectrometer (Perkin Elmer).

All the spectra have been recorded at room temperature. Moreover, the structural characterization have been completed by transmission electron microscopy TEM analysis of the CNTs and have been achieved with a Jeol 2010 FX (200 kV) microscope. In this case, some drops of the sonicated solution have been dried up on a microgrid plate (spacing≈10 µm) for the TEM analysis.

Scanning electron microscopy (SEM) has been used as the customary technique in order to achieve structural characterization.

In this respect, SEM has revealed an excellent and invaluable tool in order to detect the presence of CNTs and investigate about the arrangements of CNTs deposited on the Si substrate.

FIG. 6 shows a SEM micrograph of a sample of carbon nanotubes obtained from our suspension after deposition on a Si p$^-$ (100) substrate. It is possible to observe a set of entangled wire-like structures attributable to the presence of carbon nanotubes.

In the insert of FIG. 6, indicated with (b), is reported a SEM micrograph of the pristine and not purified soot deposited on crystalline Si, in order to compare the effect of the purification treatment.

A measurement of the diameter of the wire-like structures suggests that the wires are formed by bundles of nanotubes, the dimension of these bundles being on the order of 10 nm (nanotubes diameter=1.3 nm).

Details on the structure of carbon nanotubes have been determined by using the transmission electron microscopy (TEM). Samples, prepared starting from the sonicated solution, reveal as before the presence of wire-like structures. TEM analysis allows resolving the structures of the wires. In particular, a magnification of the wires (FIG. 6) shows as these structures are formed by bundles of CNTs where rows of carbon atoms are arranged to form the walls of the nanotubes. Moreover the distance separating the walls is about 1.3 nm which is the average diameter of the SWNTs that form our material.

Example 2

Optical Properties of SWNTs

A thorough study of the optical properties determined by the presence of SWNTs on a silicon substrate has been carried out in the infrared (IR) and near IR region, as well as in the visible and ultraviolet (UV) intervals. In order to achieve this purpose FTIR (Fourier transformed infrared) spectroscopy results have been compared with its complementary technique, i.e., the Raman spectroscopy and after that completed with the investigation achieved in the near IR and UV-Vis regions.

Figure 7A:
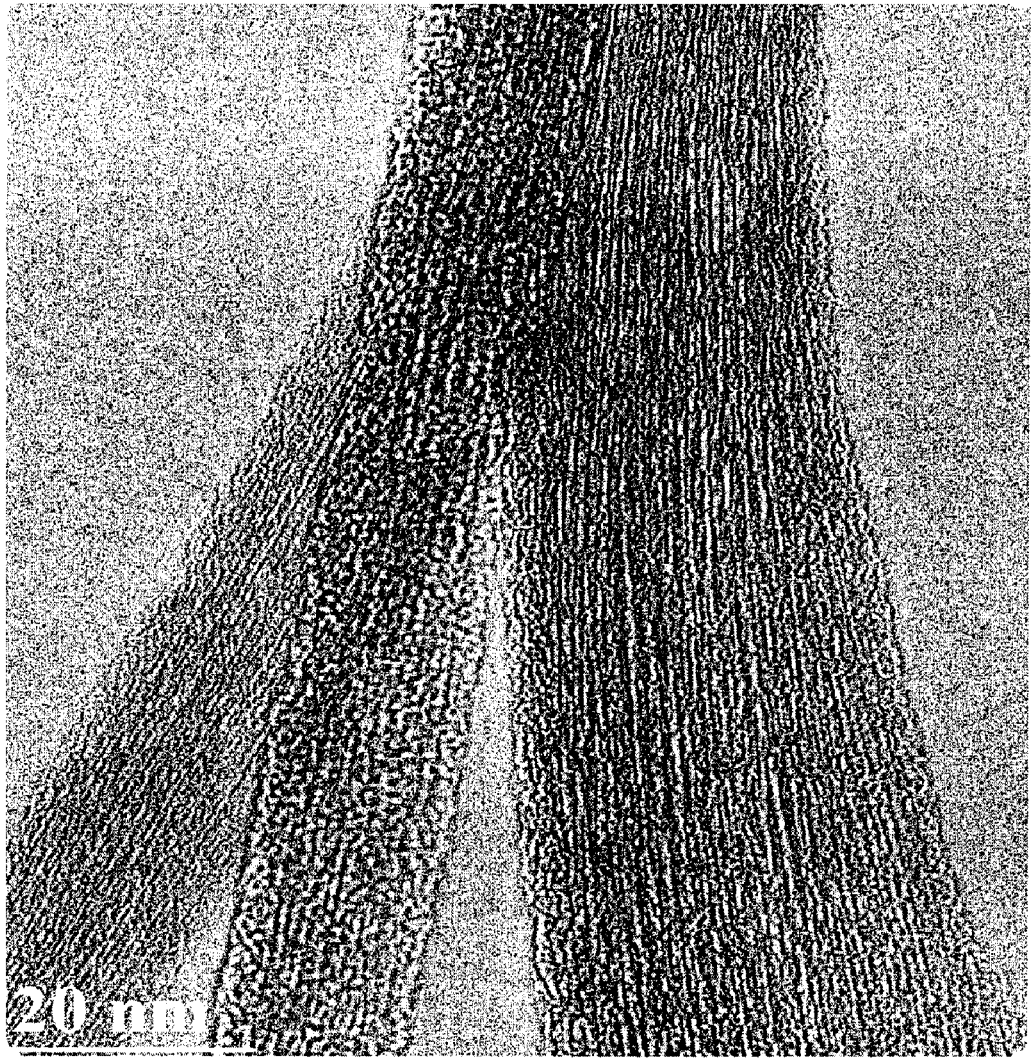
FIG. 7A is a high resolution TEM micrograph showing the structure of the bundles of SWNTs.

In particular, the optical response of the SWNTs deposited on a Si substrate to infrared light (range 400-4000 cm$^{-1}$) shows that the transmittance as a function of the number of wavelength decreases uniformly (see FIG. 7A) in agreement with the experimental data, evidencing the presence of characteristics in the region of 1300-1700 cm$^{-1}$, attributed tentatively to the C=O, and C=C vibration modes, because of the oxidation process we have used.

Whereas, the signals in the region of 2800-3000 cm$^{-1}$ have been assigned to C-H modes. In spite of this behavior, the assignment of the peaks to the IR-active modes of SWNTs (at 633, 1382, 1580 cm$^{-1}$) is not straightforward, in fact only one distinct peak at 663 cm$^{-1}$ is likely determined by an IR-active phonon vibration mode of SWNTs.

Figure 7B:
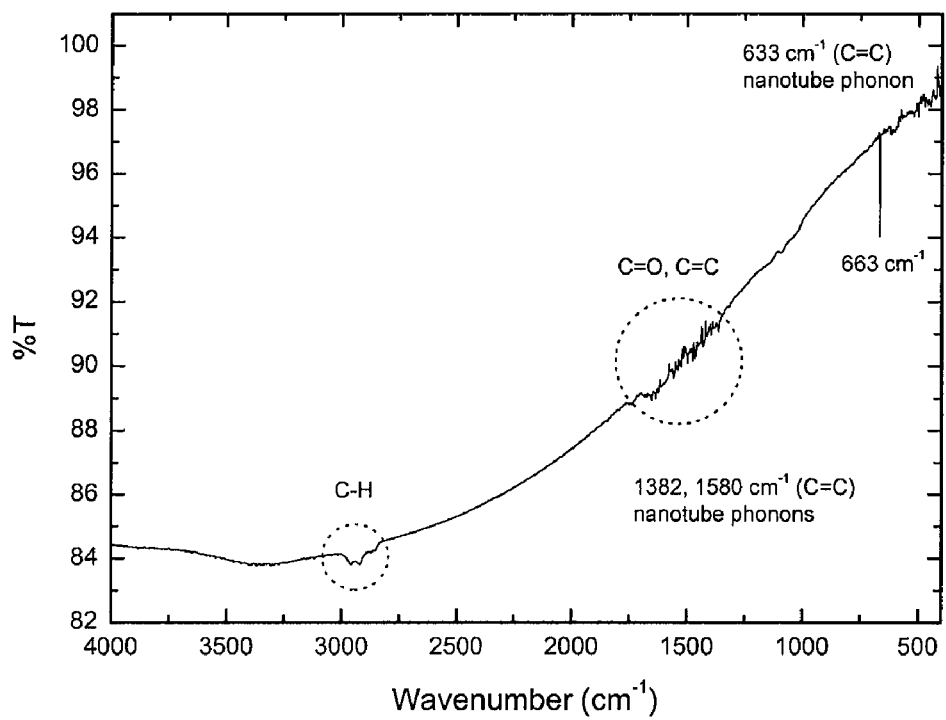
FIG. 7B is a transmission spectrum in the IR region of SWNTs deposited on Si (100) p.
Figure 7C:
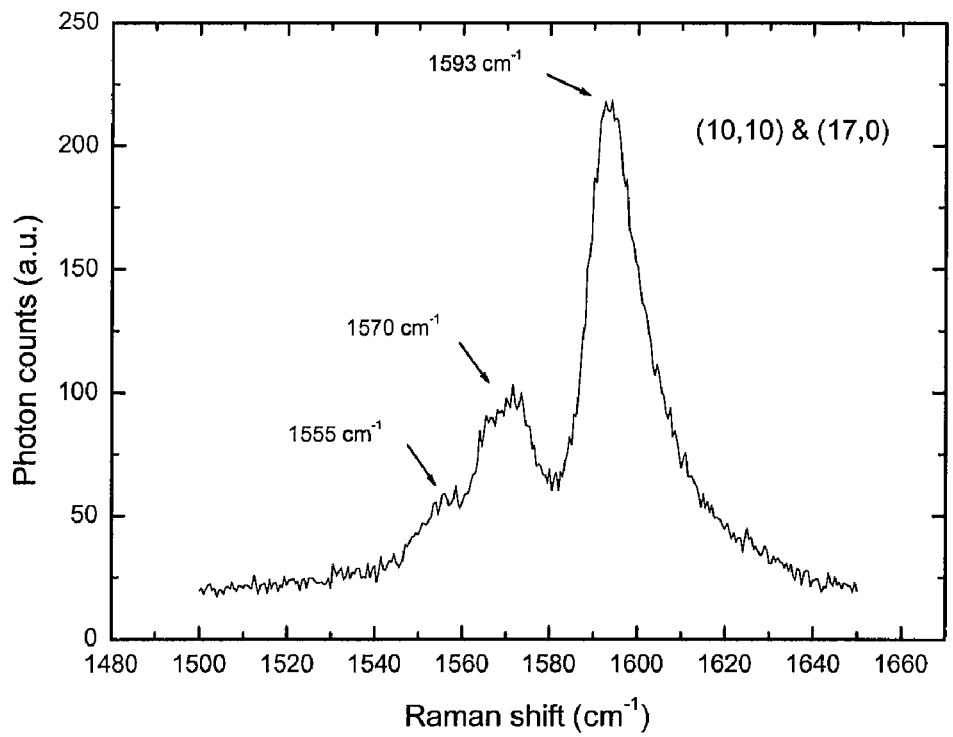
FIG. 7C is a Raman spectrum in the region of 1500-1650 cm⁻¹ of a SWNTs on Si (100) p⁻.

The optical response in the IR region has been completed and compared with the Raman scattering determined by the SWNTs deposited on a Si substrate. Because of their all-carbon structure the $E_{2g}, A_{2g}, A_{1g}$ vibration modes of SWNTs are Raman active and determine, in the IR region, a Raman scattering which gives complementary information with respect to the IR Spectroscopy, allowing the identification of SWNTs. FIG. 7B reports the Raman shifts collected in the interval 1500-1650 cm$^{-1}$ with respect to the green line (514.5 nm) of an Ar$^+$-laser used as an excitation source.

This spectrum is characterized by the presence of three adjacent peaks at 1593, 1570 and 1555 cm$^{-1}$, going from the higher peak to the lower ones, respectively. The existence of these peaks is attributable to the tangential vibration modes determined by the graphite-like structure that is also present in carbon nanotubes. Moreover, these peaks have been calculated as belonging to the $E_{2g}$ and $A_{1g}$ modes of the (10, 10) and (17, 0) nanotubes.

Optical characterization of SWNTs deposited on Si, because of the absorption of substrate in the UV-vis region, has been achieved in the range of wavelength of 200-2500 nm (UV-vis and near IR), by studying how the signal reflected by silicon is affected by the presence of SWNTs on its surface.

In fact, because of the absorption at the Si-gap of the substrate and its thickness (500 μm), no light is transmitted in the UV-vis range. Nevertheless, the reflected signal (≧30% also in the near-IR region) suffices in order to collect any information about the influence of SWNTs. On the other hand, the signal affected by the SWNTs, after a double passage of light through them, determines the square transmittance (T$^2$) of the SWNTs, so that a measurement of the transmittance of SWNTs in the whole 200-2500 nm range can be achieved.

Figures 8A, 8B:
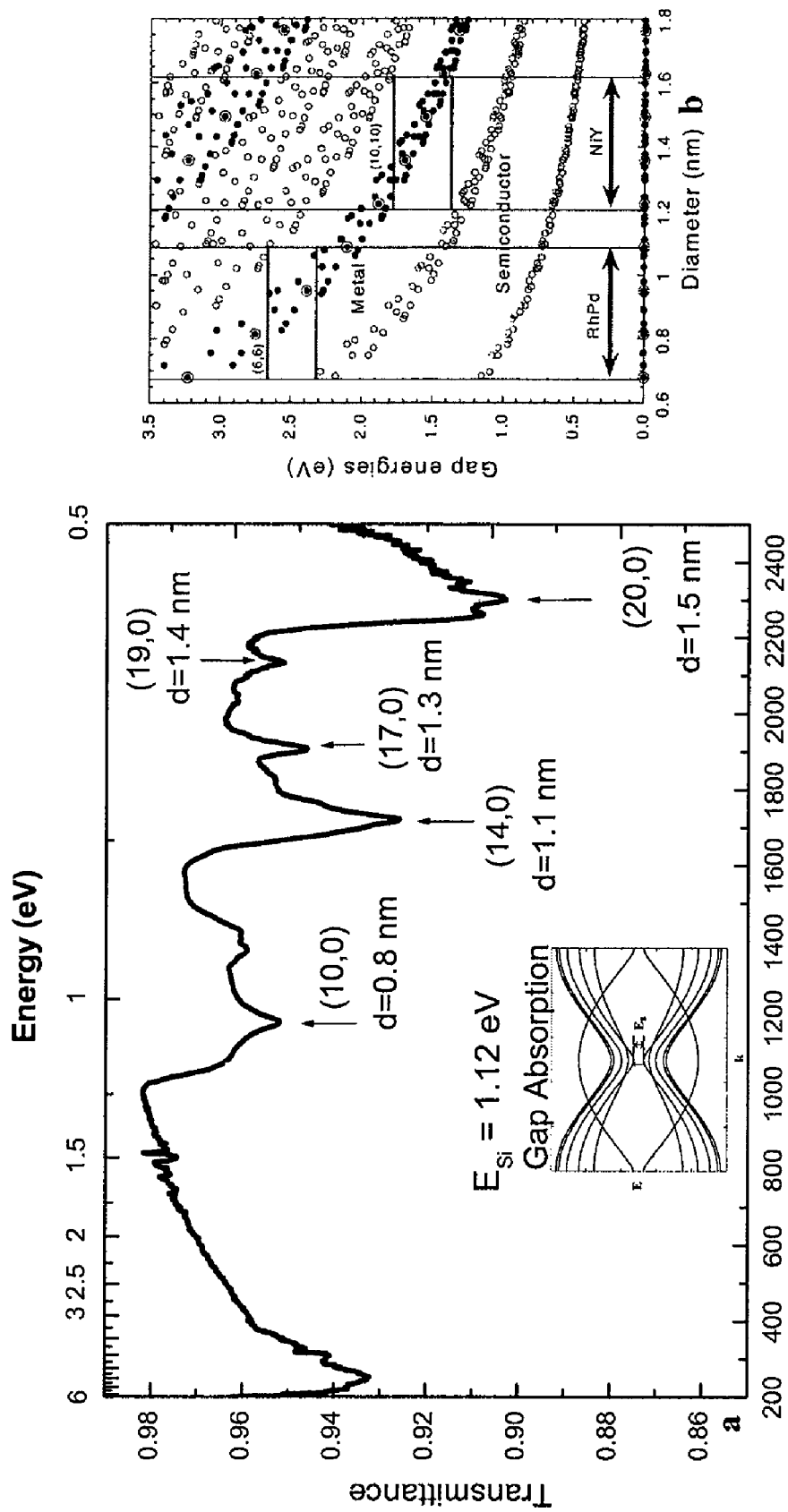
FIG. 8A shows a diagram of the transmittance as a function of the wavelength in the UV-vis and near IR regions of SWNTs deposited on a Si substrate.
FIG. 8B shows the tight binding calculation devised for zig-zag (n,0) nanotubes, using γ=2.75.

In FIG. 8A a typical spectrum of the transmittance T as a function of the wavelength is shown for a sample. This graph exhibit a set of intense absorption peaks at 1719 nm (0.72 eV), 1912 nm (0.65 eV), 2131 nm (0.58 eV) and 2305 nm (0.54 eV), two weaker peaks in the 1200-1400 nm (1.0-0.9 eV) range and a wide band below 1100 nm (1.12 eV) without any peak.

A tight binding calculation, devised for zig-zag (n,0) nanotubes reveals that the presence of these peaks is consistent with light absorption occurring at the gap of the semiconducting SWNTs, as shown in FIG. 8A. On the other hand if this absorption is determined by SWNTs, because of the continuous distribution of diameters of the nanotubes produced by arc discharge, we would expect a set of three continuous bands centered at 0.6 eV, 1.2 eV and 1.6 eV (these bands are determined by the gap of metallic nanotubes), respectively.

But there is no band centered at 1.6 eV and we observe a discrete distribution of peaks that fall within the other two bands.

Without being limited to it, an explanation is being advanced herein to explain the absence of the absorption peaks that was expected.

In fact, for example, though it is unlikely that, starting from the soot we purchased, we have been able to select some diameters or chiralities during the purification process or before, it is likely that the purification process can introduce some defects in the SWNTs, determining a rugged structure.

How a rugged structure can deteriorate the absorption properties of SWNTs is not known, nevertheless it is quite unlikely that this process eliminates entirely the contribution by the metal nanotubes and hence the band at 1.6 eV.

On the other hand in order to have an absorption in semiconducting SWNTs we need to evidence their gaps. This can be obtained by eliminating the presence of electrons in the conduction band of the semiconducting SWNTs and will be achieved if some holes are available to eliminate the electrons. Nevertheless, the oxidation process cannot selectively introduce holes in the SWNTs according to their chirality.

As a consequence, though holes' injection into the nanotubes is an essential process in order to give an explanation to all the sets of experimental data that we gained in the UV-vis and near IR region, a deeper consideration about what can introduce holes into the SWNTs must be done.

The answer to this question is given by the shoulder that may be observed in FIG. 8A at 1100 nm which corresponds to an energy of 1.12 eV which is attributable to the energy gap of silicon.

The presence of this signature reveals the role solved by Si (p type). Silicon p, which we used as a substrate, is a source of holes close to the SWNTs that can be injected into the tubes marking the presence of the gap. In particular, all those SWNTs nanotubes that have a gap greater than that of Si do not give rise to an absorption peak, since in this case their gap is covered by the gap of Si and the band at 1.6 eV will be lacking.

On the other hand, if the energy gap of SWNTs falls within the energy gap of Si we observe the absorption peaks. In this case holes' injection into the nanotubes is determined by the difference in the work functions between a SWNT of a determined chirality and that of silicon as depicted in FIG. 1. In this picture the contact between the two semiconductors, Si and the semiconducting nanotubes, is sketched.

In particular, the work function of Si has been considered as 4.35 eV with respect to the conduction band of SiO$_2$ (a layer of 1-2 nm of native oxide naturally forms on the Si surface), whereas the work function of a SWNT has been considered equal to 4.8 eV as an average.

Since the work functions of Si and SWNTs are comparable, what occurs is that for some tubes this process can be favorable and for other ones unfavorable to the holes injection, thereby determining the presence or the lack of absorption peaks in the near IR where we should have the presence of two bands.

In conclusion, the optical properties of SWNTs can be investigated by using Si p-type as a substrate. The presence of Si acts selectively by evidencing the absorption at the gap of those semiconducting SWNTs with a gap within that of Si. In particular, Si p can inject holes into the nanotubes according to the difference in work functions of Si and SWNTs. The process of holes injection suggests the possibility to build up new optoelectronic devices.

The light emitting device and corresponding manufacturing method of the present invention solve the problem of exploiting the optoelectronics properties of semiconducting SWNTs.

In particular it has been evidenced experimentally the possibility that holes can be injected from Si to semiconducting SWNTs. As a consequence of this property it has been shown a method to build light emitting diodes based on semiconducting SWNTs and consequently by implementing a Fabry Perrot cavity a laser based on semiconducting SWNTs.

The exploitation of SWNTs in the field of optoelectronics will carry many benefits to the field, because SWNTs have direct band gap and can be grafted on silicon. Moreover it has been proved that SWNTs can have also ultra fast optical switching properties, which will allow transmitting optical signals at high speeds.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method comprising:
    forming a light-emitting device, wherein the forming step comprises:
    forming a first electrode;
    forming on the first electrode an insulating layer, embedded with light-emitting single walled carbon nanotubes (SWNTs); and
    forming a second electrode directly on the insulating layer, the SWNTs being insulated from the first electrode and the second electrode by the insulating layer.

2. The method of claim 1 wherein the first electrode is p-doped silicon, and the second electrode is n-doped silicon.

3. The method of claim 2 wherein forming the insulating layer includes growing a silicon oxide layer on the first electrode.

4. The method of claim 2 wherein forming the insulating layer includes growing a silicon layer on the first electrode.

5. The method of claim 1 wherein forming the insulating layer includes depositing a silicon oxide layer.

6. The method of claim 1 wherein the insulating layer is no more than 10 nm thick.

7. A method of forming a light-emitting nanojunction comprising:
    forming a first electrode on a silicon substrate having a native oxide layer;
    depositing semiconductive light-emitting single walled carbon nanotubes (SWNTs) on a surface of the native oxide layer of the first electrode;
    growing an insulating layer on the silicon substrate, the insulating layer covering the SWNTs; and
    forming a second elect'rode directly on the insulating layer, the SWNTs being insulated from the first electrode and the second electrode by the insulating layer.

8. The method of claim 7 wherein the insulating layer is a silicon oxide layer.

9. The method of claim 7 wherein the insulating layer is a silicon layer.

10. The method of claim 7 wherein the first electrode is p-doped silicon, and the second electrode is n-doped silicon.

11. The method of claim 7 wherein the insulating layer is no more than 10 nm thick.

12. A method of forming a Fabry-Perrot microcavity comprising:
    forming a first Bragg reflector having alternating silicon and silicon oxide layers;
    forming a second Bragg reflector having alternating Si and $SiO_2$ layers; and
    forming a nanojunction positioned between the first Bragg reflector and the second Bragg reflector, wherein the nanojunction comprises an n-doped silicon electrode, a p-doped silicon electrode, and a semiconductor insulating layer including single walled carbon nanotubes (SWNTs) positioned between the n-doped silicon electrode and the p-doped silicon electrode, wherein the SWNTs are embedded in or covered by the semiconductor insulating layer.

13. The method of claim 12 wherein forming the first Bragg reflector comprises annealing a silicon oxide layer to the n-doped silicon electrode of the nanojunction.

14. The method of claim 12 wherein forming the second Bragg reflector comprises annealing a silicon oxide layer to the p-doped silicon electrode of the nanojunction.

15. The method of claim 12 wherein the semiconductor insulating layer is no more than 10 nm thick.

16. The method of claim 12 wherein the semiconductor insulating layer is formed of silicon oxide.

17. The method of claim 12 wherein the semiconductor insulating layer is formed of silicon.

* * * * *

UNITED STATES PATENT AND TRADEMARK OFFICE
CERTIFICATE OF CORRECTION

PATENT NO. : 8,008,102 B2
APPLICATION NO. : 11/958858
DATED : August 30, 2011
INVENTOR(S) : Vincenzo Vinciguerra et al.

It is certified that error appears in the above-identified patent and that said Letters Patent is hereby corrected as shown below:

Column 9
Claim 1, Line 18, "forming on the first electrode an insulating layer, embedded" should read
--forming on the first electrode an insulating layer embedded--.

Column 10
Claim 7, Line 3, "forming a second elect'rode directly on the insulating" should read
--forming a second electrode directly on the insulating--.

Signed and Sealed this
Fifteenth Day of November, 2011

David J. Kappos
*Director of the United States Patent and Trademark Office*